United States Patent
Agano

(10) Patent No.: US 6,333,505 B1
(45) Date of Patent: Dec. 25, 2001

(54) METHOD AND APPARATUS FOR OBTAINING RADIATION IMAGE DATA AND SOLID-STATE RADIATION DETECTOR

(75) Inventor: Toshitaka Agano, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/493,088

(22) Filed: Jan. 28, 2000

(30) Foreign Application Priority Data

Jan. 29, 1999 (JP) .................................................. 11-021002

(51) Int. Cl.$^7$ .............................. G01T 1/24; H01L 27/00; H01L 25/00
(52) U.S. Cl. ................................. 250/370.07; 250/370.01; 250/370.15
(58) Field of Search ............................... 250/370.7, 370.8, 250/370.9, 370.11, 370.1, 370.14, 371, 370.01

(56) References Cited

U.S. PATENT DOCUMENTS

| 4,803,359 | 2/1989 | Hosoi et al. ....................... 250/327.2 |
| 5,187,369 | 2/1993 | Kingsley et al. ................. 250/370.11 |
| 6,229,877 * | 5/2001 | Agano ................................... 378/154 |

FOREIGN PATENT DOCUMENTS

| 59-211263 | 11/1984 | (JP) . |
| 1-216290 | 8/1989 | (JP) . |
| 2-164067 | 6/1990 | (JP) . |
| 10-232824 | 9/1998 | (JP) . |
| 10-271374 | 10/1998 | (JP) . |
| 92/06501 | 4/1992 | (WO) . |

OTHER PUBLICATIONS

S. Qureshi et al.; "Material Parameters in Thick Hydrogenated Amorphous Silicon Radiation Detectors"; Lawrence Berkeley Laboratory, University of California.

Yujiro Naruse et al.; "Metal/Amorphous Silicon Multilayer Radiation Detectors"; vol. 36; No. 2; Apr. 1989.

* cited by examiner

Primary Examiner—Hung-Xuan Dang
(74) Attorney, Agent, or Firm—Sughrue Mion, PLLC

(57) ABSTRACT

A dark current component included in an image signal output from a detector of optical reading type is reduced in a radiation image data obtaining method and apparatus using the detector. A detector having radiation-insensitive areas at both ends of a stripe electrode outside an image area along the longitudinal direction thereof is used. An image signal output from a current detection amplifier is converted into image data having digital values by an A/D converter and input to a memory. A correction data calculation circuit finds correction data gradually decreasing from a starting area to the ending area of vertical scan in accordance with each position of each element along the longitudinal direction thereof, based on image data of the insensitive areas corresponding to the scan starting and ending areas. For each element, a subtraction circuit subtracts the correction data from image data of an image area.

16 Claims, 5 Drawing Sheets

XZ CROSS SECTION

XY CROSS SECTION

XY CROSS SECTION

XY CROSS SECTION

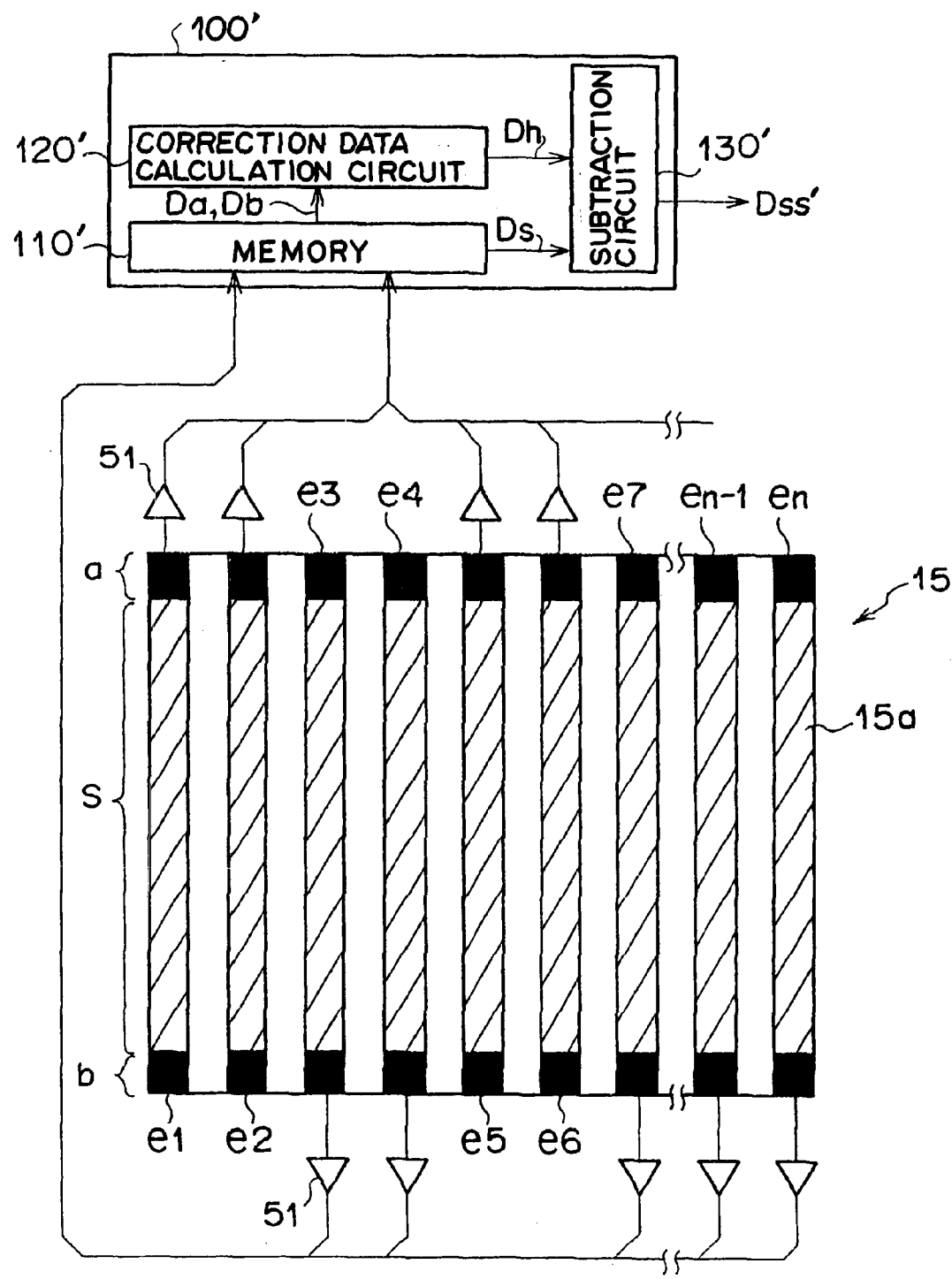
F I G. 6

METHOD AND APPARATUS FOR OBTAINING RADIATION IMAGE DATA AND SOLID-STATE RADIATION DETECTOR

BACKGROUND OF THE INVENTION

1. Field of the Invention

The present invention relates to a radiation image data obtaining method and a radiation image data obtaining apparatus for obtaining an image signal representing radiation image information from a solid-state radiation detector, especially from a detector having a stripe electrode, and also to the radiation detector used therefor.

2. Description of the Related Art

In today's radiation photography aimed at medical diagnoses or the like, radiation image reading and recording apparatuses using solid-state radiation detectors (whose main part comprises semiconductors) for outputting image signals representing radiation image information by detecting radiation have been known. As the solid-state radiation detectors used therefor, various types have been proposed and put into practice.

In terms of an electric charge generation process in which radiation is converted into an electric charge, solid-state radiation detectors of different types, such as optical conversion type detectors (see Japanese Unexamined Patent Publication Nos. 59(1984)-211263 and 2(1990)-164067, PCT International Publication No. W092/06501, and SPIE Vol. 1443 Medical Imaging V; Image Physics (1991), p. 108–119, for example) and direct conversion type detectors (MATERIAL PARAMETERS IN THICK HYDROGENATED AMORPHOUS SILICON RADIATION DETECTORS, Lawrence Berkeley Laboratory. University of California, Berkeley, Calif. 94720 Xerox Parc. Palo Alto. Calif. 94304, Metal/Amorphous Silicon Multilayer Radiation Detectors, IEEE TRANSACTIONS ON NUCLEAR SCIENCE. VOL. 36. NO.2. Apr. 1989, and Japanese Unexamined Patent Publication No. 1(1989)-216290, for example) have been known. In an optical conversion type detector, light emitted from phosphor by exposing the phosphor to radiation is detected by a photoelectric conversion device and a signal electric charge thereby obtained is stored in a capacitor of the device. The stored electric charge is then converted into an image signal (electric signal) and the signal is output. In a direct conversion type detector, a signal electric charge generated within a radiation conductive material by exposing the material to radiation is collected by an electric charge collecting electrode and stored in a capacitor. The stored electric charge is then converted into an electric signal and the signal is output.

With respect to an electric charge reading process in which a stored electric charge is read out, solid-state radiation detectors of other types, such as TFT reading type detectors which read the charge by scanning TFT's (Thin Film Transistors) connected to capacitors and optical reading type detectors in which a charge is read by irradiating reading light (an electromagnetic wave for reading) thereon have been known.

The present applicant has proposed radiation detectors of improved direct conversion type (see Japanese Patent Application Nos. 10(1998)-232824 and 10(1998)-271374). A radiation detector of improved direct conversion type means a radiation detector employing both the direct conversion method and the optical reading method. The radiation detector of improved direct conversion type comprises a first conductive layer which is transparent to radiation for recording, a photoconductive layer for recording exhibiting photoconductivity (or, more accurately, radiation conductivity) when receiving the radiation for recording which has passed through the first conductive layer, an electric charge transport layer which acts approximately as an insulator to an electric charge having the same polarity as an electric charge charged in the first conductive layer while acting approximately as a conductor to an electric charge having the reverse polarity, a photoconductive layer for reading exhibiting photoconductivity (or, more accurately, electromagnetic wave conductivity) when receiving an electromagnetic wave for reading, and a second conductive layer which is transparent to the electromagnetic wave for reading, with these layers being stacked in this order. A signal electric charge (latent image electric charge) representing image information is stored at the interface (capacitor) between the photoconductive layer for recording and the electric charge transport layer. The first and the second conductive layers function as electrodes. The photoconductive layer for recording, the electric charge transport layer, and the photoconductive layer for reading comprise the main part of the solid-state detector of this type.

In the optical reading method including the improved direct conversion method, 3 types of signal detection methods are used for reading a signal electric charge stored in a capacitor. In one of the 3 methods, the second conductive layer (hereinafter called reading electrode) onto which the reading light is irradiated has a flat shape, and the signal electric charge is detected by scanning the reading electrode with spot-like reading light such as a laser beam. In the other 2 methods, the reading electrode is a stripe electrode having linear electrodes aligned in a comb-like shape. Letting the direction almost orthogonal to the longitudinal direction of the stripe electrode, that is, the direction orthogonal to the longitudinal direction of each linear electrode, be the main scan direction, while letting the longitudinal direction be the vertical scan direction, spot-like reading light scans along the main and the vertical scan directions to detect the signal charge. Alternatively, a linear light source elongated along the main scan direction scans the stripe electrode longitudinally (that is, along the vertical scan direction) to detect the signal charge.

However, in a detector employing the optical reading method, not only is a current in accordance with the electric charge accumulated in the capacitor corresponding to an area onto which the reading light irradiated, but also a dark current accumulated in the vicinity of the capacitor corresponding to the area, or in the entire capacitor, flows when the electric charge is read from the capacitor. Furthermore, in a detector having the stripe electrode as the reading electrode, a dark current flows into the linear electrode from a pixel other than a target pixel when the reading light is irradiated onto the target pixel in the longitudinal direction of the linear electrode. In other words, in the optical reading type detectors including the detectors having the stripe electrodes, an image signal output therefrom includes a dark current component in addition to a desired image signal component. Therefore, offset due to the dark current is generated in the image reproduced based on the output image signal and causes density of the image to increase. In the case of detectors having the stripe electrodes, this problem is prominent, since the dark current component along the entire longitudinal direction is added to the signal of a target pixel.

SUMMARY OF THE INVENTION

The present invention has been conceived based on consideration of the above problems. The present invention therefore relates to a radiation image data obtaining method and a radiation image data obtaining apparatus for correcting an image signal to reduce a dark current component included in the image signal output from an optical reading type detector, and also to a solid-state radiation detector used therefor.

A radiation image data obtaining method of the present invention obtains an image signal representing radiation image information from a solid-state radiation detector of optical reading type having a capacitor for storing an electric charge in accordance with a dose of radiation irradiated thereon and a stripe electrode comprising a plurality of linear electrodes stacked on the capacitor, and the radiation image data obtaining method is characterized in that:

a radiation detector having a radiation-insensitive area corresponding to a portion of the stripe electrode in the longitudinal direction thereof is used as the solid-state radiation detector, and correction of a component of the image signal corresponding to an area other than the insensitive area is carried out for every linear electrode in the longitudinal direction of the stripe electrode so that a dark current component included in the image signal is reduced based on a component of the image signal corresponding to the insensitive area.

The "stripe electrode" herein referred to means an electrode comprising the linear electrodes aligned in a comb-like shape. The "longitudinal direction of the stripe electrode" means the longitudinal direction of the linear electrodes.

When the "radiation-insensitive area" is formed on the detector, a material having no sensitivity to radiation may be used in an area to be radiation-insensitive, instead of a photoconductive layer for recording to be used in the area. Alternatively, the photoconductive layer for recording in the area may be covered with a material absorbing radiation, such as lead. In this manner, radiation for recording is not irradiated onto the photoconductive layer for recording in the area, or the electric charge in accordance with the radiation dose is not practically stored even if a substantially small dose of radiation is irradiated thereon.

The phrase stating that "a component of the image signal corresponding to an area other than the insensitive area is corrected for every linear electrode . . . so that a dark current component included in the image signal is reduced based on a component of the image signal corresponding to the insensitive area" means that for the area other than the insensitive area, the dark current component is reduced in the image signal including the dark current component. For example, the dark current component included in the image signal is reduced not only by subtraction of the component of the insensitive area from the component of the remaining area, but also by any correction method resulting in reduction of the dark current component in the image signal for the remaining area by using various processing based on the component of the insensitive area.

The "subtraction of the component of the insensitive area from the component of the remaining area" means not only subtraction of the image signal component corresponding to the insensitive area from the image signal component corresponding to the area other than the insensitive area, but also subtraction of a correction signal found based on the signal component of the insensitive area and regarded as the component of the insensitive area at each position in the area other than the insensitive area in the longitudinal direction of the stripe electrode from the image signal component of the area other than the insensitive area.

In the radiation image data obtaining method of the present invention, in order not to cause a problem with the radiation image information due to the insensitive area, it is preferable for the solid-state detector of image signal radiation to have the insensitive area in an area other than an image area in the longitudinal direction of the stripe electrode. The "image area" herein referred to means an area where a desired radiation image is normally photographed. In other words, the image area means an area in the detector where the electric charge representing the radiation image information is stored.

In the above radiation image information obtaining method of the present invention, a solid-state radiation detector having the insensitive areas at one end of the stripe electrode can be used as the radiation detector.

Furthermore, in the radiation image information obtaining method of the present invention, a solid-state radiation detector having the insensitive areas at both ends of the stripe electrode can be used. The correction is carried out by finding a correction component for the image signal at each position in an area other than the insensitive areas in the longitudinal direction of the stripe electrode, based on a image signal component of each of the insensitive areas at both ends.

A radiation detector having the insensitive areas at only a portion of the linear electrodes of the stripe electrode can also be used. For linear electrodes not having the insensitive areas, a correction component of the image signal at each position in an area other than the insensitive area is found in the longitudinal direction of the stripe electrode and the correction component is subtracted from the image signal component of the area other than the insensitive area.

Moreover, a radiation detector including both a linear electrode having the insensitive area at one end of the stripe electrode and a linear electrode having the insensitive area at the other end thereof, that is, a radiation detector having a stripe electrode whose insensitive areas exist at either one of the ends thereof, may be used. For the linear electrodes having the insensitive areas at either one of the ends and the linear electrodes not having the insensitive areas (that is, for all linear electrodes), a correction component of the image signal at each position on the stripe electrode other than the insensitive areas is found in the longitudinal direction of the stripe electrode, based on a component of the insensitive areas at one end and the other end, and the correction component is subtracted from the image signal component of the area other than the insensitive areas.

If the radiation detector having the insensitive areas at either one of the ends is used, it is preferable for the insensitive areas to be located alternately. The term "alternately" means not only at every other electrode but also at every several linear electrodes.

In the radiation image data obtaining method of the present invention, it is preferable for the image signal for a portion of the linear electrodes aligned successively and the image signal for the remaining linear electrodes among the successively aligned linear electrodes to be obtained at one end of the stripe electrode and at the other end thereof, respectively.

The "linear electrodes aligned successively" mean not only 2 electrodes aligned next to each other but also more than 3 linear electrodes.

The phrase stating that "the image signal for a portion of the linear electrodes aligned successively and the image signal for the remaining linear electrodes among the successively aligned linear electrodes are obtained at one end of the stripe electrode and at the other end thereof, respectively" means that the image signal for each linear electrode is obtained by placing the one end and the other ends at every other electrode or at every several electrodes. For example, in the case where image signals for 4 linear electrodes are obtained, image signals for 2 electrodes in the right are obtained at one end of the stripe electrode while image signals for the remaining 2 electrodes in the left are obtained at the other end of the stripe electrode.

In the case where there are multiples of the linear electrodes in the detector, such as 100 electrodes for example, the structure of "linear electrodes aligned successively" is repeated. In other words, one end and the other end of the linear electrodes are positioned alternately at every other linear electrode or at every several electrodes and the image signal for each linear electrode is obtained.

A radiation image data obtaining apparatus of the present invention is an apparatus for realizing the above method. In other words, the radiation image data obtaining apparatus of the present invention comprises a solid-state radiation detector including a capacitor for storing an electric charge in accordance with a dose of radiation irradiated on the detector and a stripe electrode comprising linear electrodes stacked on the capacitor, and reading means for obtaining an image signal representing radiation image information by a scan with reading light in the longitudinal direction of the stripe electrode, and the radiation image data obtaining apparatus is characterized in that:

the radiation detector has a radiation-insensitive area in a portion of the stripe electrode, and the apparatus comprises dark current reduction means for carrying out correction of a component of the image signal corresponding to an area other than the insensitive area so that a dark current component included in the image signal is reduced for each linear electrode in the longitudinal direction of the stripe electrode, based on a component of the image signal corresponding to the insensitive area.

In the radiation image data obtaining apparatus of the present invention, the radiation detector may have the insensitive areas at both ends of the stripe electrode, and the dark current reduction means finds a correction component of the image signal at each position in an area other than the insensitive areas in the longitudinal direction of the stripe electrode, based on components of the image signal for the insensitive areas at both ends, and carries out the correction based on the correction component having been found.

Alternatively, the radiation detector may have the insensitive area only at a portion of the linear electrodes and, the dark current reduction means finds, for the linear electrodes not having the insensitive area, a correction component of the image signal at each position in an area other than the insensitive area in the longitudinal direction of the stripe electrode, based on a component of the image signal for the insensitive area of the linear electrode having the insensitive area.

The radiation detector may also comprise a stripe electrode including linear electrodes having the insensitive areas alternately at either one of the ends thereof, and the dark current reduction means finds a correction component of the image signal for the linear electrodes having and not having the insensitive areas, at each position in the longitudinal direction of the stripe electrode except for the insensitive areas, based on components of the insensitive areas at one end and the other end of the linear electrodes, and subtracts the correction component from an image signal component for an area other than the insensitive areas.

In the radiation image data obtaining apparatus of the present invention, it is preferable for the reading means to obtain, at one of the ends of the stripe electrode, the image signal for a portion of the successively aligned linear electrodes and to obtain, at the other end of the stripe electrode, the image signal for the remaining linear electrodes. For example, in the case where a linear light source scans the stripe electrode in the longitudinal direction thereof to detect the signal electric charge, the linear electrodes having the insensitive areas at one end and the other end are alternately placed at every other linear electrode or at every several electrodes and an electric current detection amplifier is connected to one or the other end of each of the linear electrodes.

A solid-state radiation detector of the present invention is a radiation detector used in the method and the apparatus described above. In other words, the radiation detector of the present invention has a capacitor for storing an electric charge in accordance with a dose of radiation irradiated thereon and a stripe electrode comprising linear electrodes stacked on the capacitor, and the radiation detector is characterized in that the stripe electrode has a radiation-insensitive area.

It is preferable for the radiation detector of the present invention to have the insensitive area in an area other than a desired image area in the longitudinal direction of the stripe electrode.

The insensitive area may be located at one of the ends of the stripe electrode or at both ends of the stripe electrode.

Alternatively, the radiation detector of the present invention may include linear electrodes having the insensitive areas at only one end of the stripe electrode and linear electrodes having the insensitive areas only at the other end of the stripe electrode.

Furthermore, it is preferable for the radiation detector of the present invention to comprise an electric current detection amplifier connected to one end of the stripe electrode in order to obtain an image signal for a portion of successively aligned linear electrodes, and an electric current detection amplifier connected to the other end of the stripe electrode in order to obtain an image signal for the remaining linear electrodes among the successively aligned linear electrodes.

According to the radiation image data obtaining method and apparatus of the present invention, the radiation detector has the radiation-insensitive areas in a portion of the stripe electrode in the longitudinal direction thereof, such as at one or both ends of the stripe electrode in an area other than the image area, and the image signal component for an area other than the insensitive area is corrected in such a manner that the dark current component included in the image signal is reduced based on the correction component found at the insensitive areas or found based on the component at the insensitive areas. Therefore, no offset due to the dark current is created in an image reproduced based on the image signal whose dark current component has been reduced, and an image having appropriate density can be obtained.

Even if the insensitive area does not exist at every linear electrode, the correction component for the linear electrodes lacking the insensitive area can be found based on the component of the insensitive area of the linear electrode having the insensitive area. Therefore, the insensitive area can be set conveniently in such a manner that the image area is minimally affected by the insensitive area.

Furthermore, by alternately placing one end and the other end of the stripe electrode and by connecting the current detection amplifiers to the one end and the other end of the linear electrodes, the image signal for a portion of the successively aligned linear electrodes is obtained at the one end of the stripe electrode and the image signal for the remaining linear electrodes is obtained at the other end thereof, and the correction component of the image signal at each position except for the insensitive areas in the longitudinal direction of the stripe electrode can be found by using the component of the insensitive area of neighboring linear electrode. Therefore, a fluctuation factor of the dark current component at each position in the longitudinal direction due to resistance of the linear electrode can be corrected. Moreover, by positioning the electric current detection amplifiers comprising the reading means close to either end of the stripe electrode in approximately equal areas, not at only one end thereof, the electric current detection amplifiers can be conveniently integrated into the detector.

BRIEF DESCRIPTION OF THE DRAWINGS

FIG. 6 is an illustration showing an outline of another aspect of the radiation image photographing and reading apparatus to which the radiation image data obtaining method and the radiation image data obtaining apparatus of the present invention are applied.

DESCRIPTION OF THE PREFERRED EMBODIMENTS

Figure 1A:
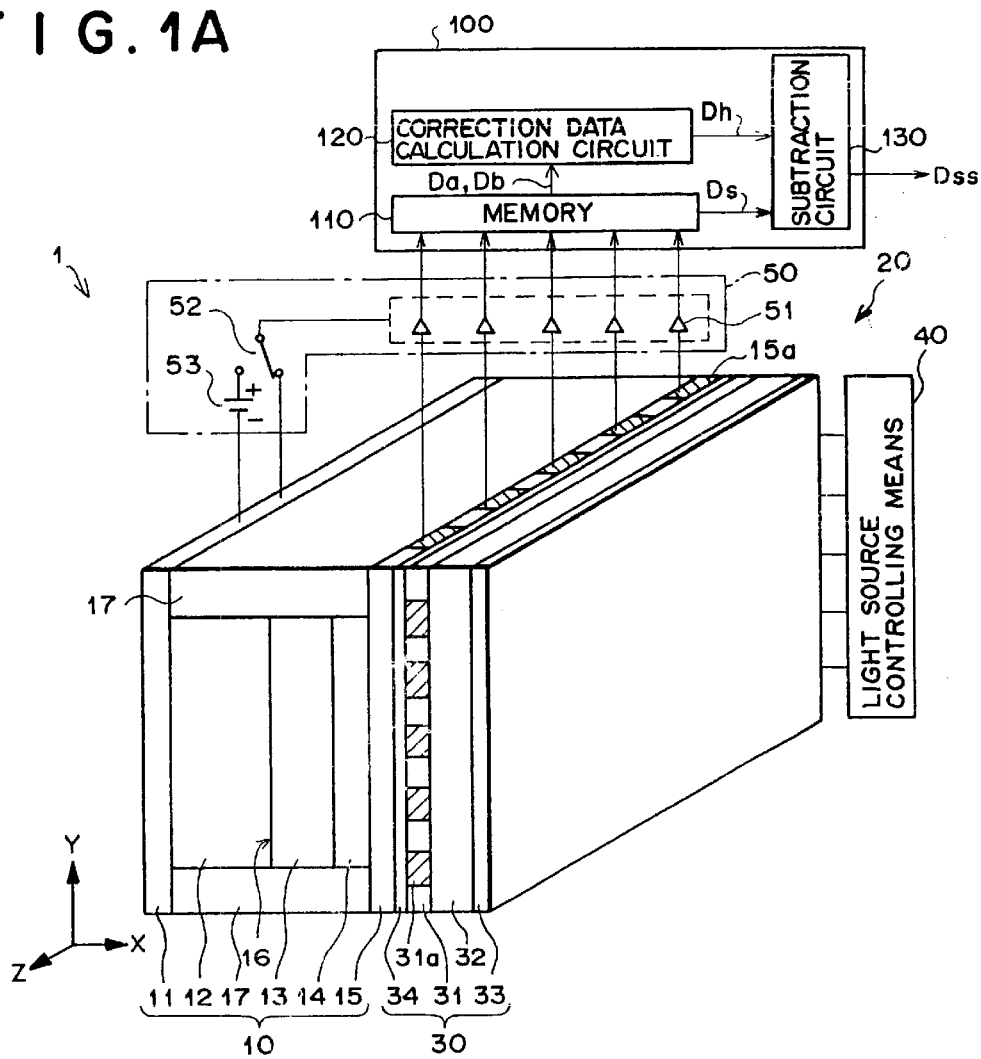
FIGS. 1A through 1C are illustrations showing an outline of a radiation image photographing and reading apparatus to which a radiation image data obtaining method and a radiation image data obtaining apparatus of the present invention are applied.
Figure 1B:
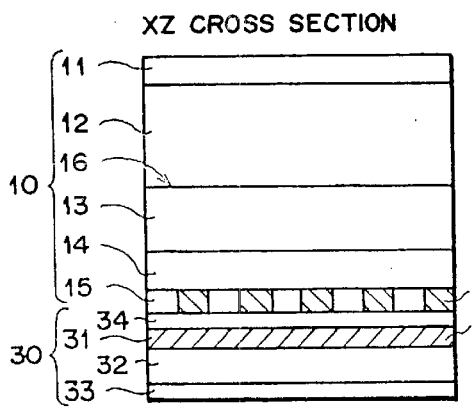
Figure 1C:
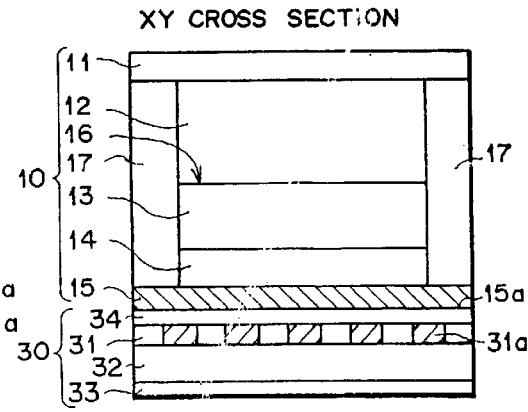

Hereinafter, embodiments of the present invention will be explained with reference to the accompanying drawings. FIG. 1 is an illustration showing an outline of a radiation image photographing and reading apparatus to which a radiation image data obtaining method and apparatus of the present invention is applied. FIG. 1(A) is an oblique view, and FIGS. 1(B) and 1(C) are X-Z and X-Y cross-sections of a radiation detector, respectively. In FIG. 1(A), a portion (such as a power source) of a recording apparatus for recording an electrostatic latent image in a detector 10, light source controlling means 40 for controlling a planar light source 30 for reading, and an electric current detection circuit 50 are also shown. As shown in FIG. 1, a radiation image photographing and reading apparatus 1 includes a reading unit 20 comprising the solid state radiation detector 10, the planar light source 30 stacked on the radiation detector 10 for reading an electric charge from the detector 10, the light source controlling means 40 for controlling the light source 30, and the current detection circuit 50.

The detector 10 records radiation image information as an electrostatic latent image and generates an electric current in accordance with the electrostatic latent image by being scanned with an electromagnetic wave for reading (hereinafter called reading light). More specifically, the detector 10 comprises a first conductive layer 11 which is transparent to radiation for recording (such as X-rays; hereinafter called recording light), a photoconductive layer 12 for recording presenting conductivity by being exposed to the recording light, an electric charge transport layer 13 which acts approximately as an insulator to an electric charge generated in the conductive layer 11 (a latent image polarity charge; a negative charge, for example) and acts approximately as a conductor to an electric charge having the reverse polarity (a transport polarity charge; a positive charge in the above example), a photoconductive layer 14 for reading which presents conductivity by being exposed to the reading light, and a second conductive layer 15 which is transparent to the reading light, with these layers being stacked in this order (see an electrostatic recording device described in Japanese Patent Application No. 10(1998)-232824). The conductive layer 15 as the reading electrode comprises a plurality of linear electrodes (the portions marked with oblique line patterns in FIG. 1) aligned in a comb-like shape. Hereinafter, the conductive layer 15 is called a stripe electrode, and each linear electrode is called an element 15a (whose element number ranges from e1 to en).

The planar light source 30 is an EL (electroluminescence) illuminant comprising a conductive layer 31, an EL layer 32, and a conductive layer 33. As has been described above, the light source is stacked on the detector 10. An insulator layer 34 is located between the stripe electrode 15 of the detector 10 and the conductive layer 31. The conductive layer 31 is formed in a comb-like shape so that each tooth of the layer 31 crosses (in this example approximately orthogonal to) the elements 15a of the stripe electrode 15 of the detector 10. In this manner, a plurality of linear light sources are formed in a plane by teeth 31a (the portions marked with oblique line patterns in FIG. 1). Each tooth 31a is connected to the light source controlling means 40 and is transparent to EL light from the EL layer 32. The wavelength of the EL light emitted from the EL layer 32 is appropriate for reading the electrostatic latent image from the detector 10.

The light source controlling means 40 applies a predetermined voltage between each of the teeth 31a and the conductive layer 33 facing the teeth. Sequentially changing the teeth 31a from one to another, the light source controlling means 40 applies the predetermined voltage between each of the teeth 31a and the conductive layer 33, and the EL light is emitted from the EL layer 32 sandwiched between the teeth 31a and the conductive layer 33. The EL light having passed through the teeth 31a is used as linear reading light (hereinafter called linear light). In other words, the configuration of the planar light source 30 is equivalent to a configuration in which minute linear light sources are aligned in a plane. By having the EL light emitted from one end to the other end of the stripe electrode in the longitudinal direction while sequentially changing the teeth 31a, an entire surface of the stripe electrode 15 is electrically scanned with the linear light.

The current detection circuit 50 comprises a plurality of current detection amplifiers 51 each connected at its inverting input terminal to the elements 15a of the stripe electrode 15. The conductive layer 11 of the detector 10 is connected to one of the input terminals of connection means 52 and to the negative electrode of a power source 53. The positive electrode of the power source 53 is connected to the other input terminal of the connection means 52. Output from the connection means 52, which is not shown in FIG. 1, is connected to the non-inverting input terminal of each of the current detection amplifiers 51. By exposing the stripe electrode 15 to the linear light as the reading light from the planar light source 30, each of the current detection amplifiers 51 simultaneously (in parallel) detects a current flowing through each of the elements 15a connected thereto. Various configurations can be adopted to the current detection amplifiers 51, although detailed explanation thereof is out of the scope of the present invention and omitted here. Depending on a configuration of the current detection amplifiers 51, the connection between the connection means 52, the power source 53, and each of the elements 15a may be different from the above example.

In the radiation image photographing and reading apparatus 1 having the above configuration, the connection means 52 is switched to be connected to the power source 53 when the electrostatic latent image is recorded in the detector 10. Thereafter, a direct current voltage is applied between the conductive layer 11 and the stripe electrode 15 to cause both of them to be electrified. The recording light is then irradiated onto a subject which is not shown, and radiation (recording light) having passed through the subject and representing radiation image information of the subject is irradiated onto the detector 10. A charged couple of positive and negative charges is then generated within the photoconductive layer 12 for recording, and the negative charge is concentrated to each of the elements 15a of the stripe electrode 15 according to a predetermined electric field distribution, and the negative charge is stored in the capacitor 16 which is the interface between the photoconductive layer 12 and the charge transport layer 13. The amount of the negative charge (latent image charge) stored in the capacitor is approximately proportional to the radiation dose and thus represents the electrostatic latent image to be recorded in the detector 10. Meanwhile, the positive charge generated within the photoconductive layer 12 is attracted to the conductive layer 11 and disappears when re-coupled with a negative charge from the power source 53.

When the electrostatic latent image is read from the detector 10, the connection means 52 is connected to the conductive layer 11 of the detector 10. The light source controlling means 40 applies a predetermined direct current voltage between each of the teeth 31a and the conductive layer 33 while sequentially changing the teeth 31a from one to another. In this manner, the linear light emitted from the EL layer 32 electrically scans the entire surface of the detector 10.

A charged couple of negative and positive charges are generated by the scan with the linear light, within the photoconductive layer 14 corresponding to a vertical scan position where the linear light enters. The positive charge rapidly moves within the charge transport layer 13 toward the negative charge (latent image charge) stored in the capacitor 16, and disappears by being re-coupled with the latent image charge in the capacitor 16. Meanwhile, the negative charge generated within the conductive layer 14 disappears by being re-coupled with the positive charge supplied to the conductive layer 15 from the power source 53. In this manner, the negative charge stored within the detector 10 disappears by charge re-coupling and a current caused by the movement of the charge upon re-coupling is generated within the detector 10. The current is simultaneously detected by each of the current detection amplifiers 51 connected to each of the elements 15a. The current flowing through the detector 10 upon reading is in accordance with the latent image charge, that is, in accordance with the electrostatic latent image. Therefore, by detecting this current, the electrostatic latent image can be read. In other words, an image signal representing the electrostatic latent image can be obtained.

Figure 2:
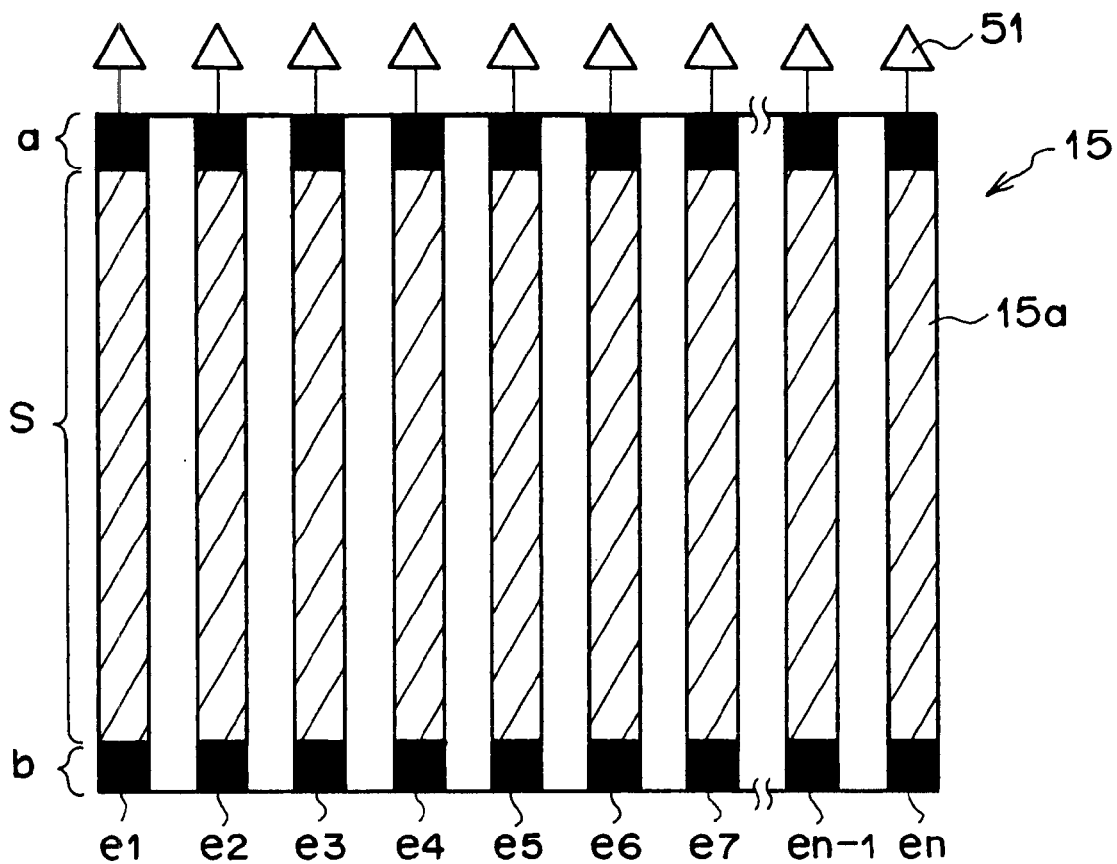
FIG. 2 is a plain view of a stripe electrode (reading electrode) of a radiation detector.

In the apparatus 1 having the above configuration, the detector 10 has radiation-insensitive areas a and b at both ends of the stripe electrode 15 in the longitudinal direction thereof, outside an image area S where image information can be recorded. All the elements 15a of the stripe electrode 15 extend to the ends of the detector 10 in order to correspond to the insensitive areas. FIG. 2 is a plan view of the stripe electrode 15 of the detector 10, showing the insensitive areas a and b.

Figure 3A:
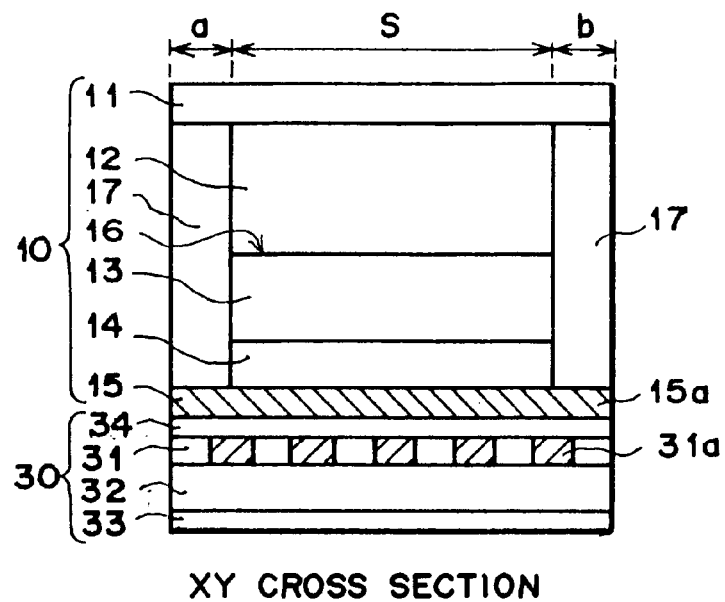
FIGS. 3A and 3B are illustrations each showing how an insensitive area is formed.
Figure 3B:
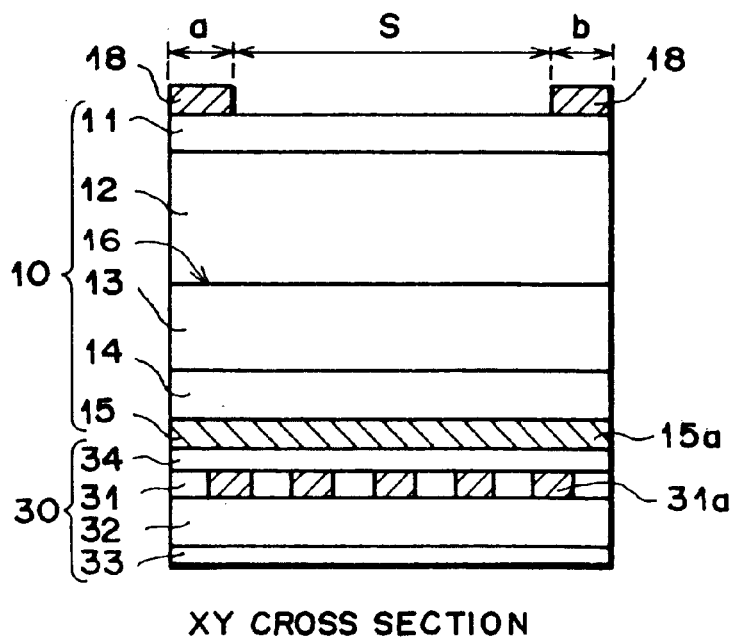

FIG. 3 shows how the insensitive areas a and b are formed. As shown in FIG. 3(A) [and FIG. 1(C)], the insensitive areas a and b may be formed on the side of the photoconductive layer 12 corresponding to each of the elements 15a by using a radiation-insensitive material 17 instead of the photoconductive layer. Alternatively, as shown in FIG. 3(B), the insensitive areas may be formed as areas which cause the corresponding portions of the capacitor 16 to hardly store an electric charge representing the image information, by covering the conductive layer 11 with a material 18 having high radiation absorbability, such as lead, so that the photoconductive layer 12 receives very little or no radiation for recording in these areas.

Figure 4:
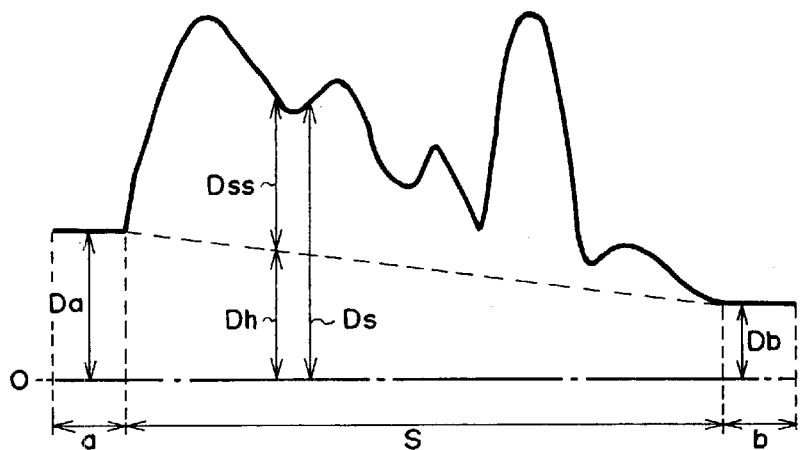
FIG. 4 is a diagram showing correction data and an example of a waveform of an image signal output from an amplifier.

If the insensitive areas are formed in the manner described above, a waveform of the image signal output from each of the current detection amplifiers 51 connected to each of the elements el~en is as shown in FIG. 4. In this waveform, both ends of the image area (outside the image area), that is, starting and ending areas of the scan along the longitudinal direction of the stripe electrode (the vertical scan direction), show voltages corresponding to the insensitive areas a and b, while the image area has a signal voltage corresponding to the radiation image information in accordance with the electric charge stored in the capacitor 16.

As has been described above, in the detector reading the stripe electrode, not only does a current in accordance with the electric charge stored in the capacitor 16 corresponding to a target pixel of each element on which the reading light is being irradiated flow into each element, but also a current in accordance with a total amount of an electric charge stored in the capacitor 16 corresponding to portions other than the target pixel flows therein as a dark current. At this time, the electric charge stored in the capacitor 16 is sequentially read as the image signal by vertical scan of the stripe electrode 15 with the reading light. Therefore, a total electric charge stored in the capacitor 16 stacked in order to correspond to each of the elements gradually decreases. For this reason, as shown in FIG. 4, in the image signal output from the current detection amplifiers 51, the dark current component for the insensitive area a at the starting area of the scan is larger than the component for the insensitive area b at the ending area of the scan. For the image area, the signal component representing the image information is superposed onto the dark current component. At the insensitive area b at the scan end area, all the electric charge stored in the capacitor 16 is supposed to have been read, and theoretically the dark current component is not generated. However, in some cases, the electric charge cannot be read completely and remains as a residual charge in the detector 10. In this case, the dark current component corresponding to the residual charge is generated. Therefore, when the image is reproduced based on the image signal output from the amplifiers 51, the image has increased density due to offset caused by the dark current.

Meanwhile, the apparatus 1 to which the present invention is applied has dark current reduction means 100 for carrying out correction of the image signal to reduce the dark current component included in the image signal. Hereinafter, the dark current reduction means 100 will be explained in detail.

As shown in FIG. 1, the dark current reduction means 100 connected to the amplifiers 51 comprises a memory 110, a correction data calculation circuit 120, and a subtraction circuit 130. The image signal output from the amplifiers 51 is converted into image data having digital values by an A/D converter which is not shown, and input to the memory 110 of the reduction means 100. The correction data calculation circuit 120 finds correction data Dh which gradually decreases from the starting area to the ending area of the vertical scan in accordance with a position of the vertical scan in the longitudinal direction of each of the elements 15a, based on image data Da at the insensitive area a corresponding to the vertical scan start area and image data Db at the insensitive area b corresponding to the vertical scan end area. The gradually changing correction data Dh are conveniently found for each element by linear interpolation of the data Da and Db of the insensitive areas at the starting and ending areas of the vertical scan respectively, as shown by a broken line in FIG. 4.

The subtraction circuit 130 carries out, for each of the elements 15a, processing of subtracting the correction data Dh from image data Ds of the image area. As a result of this processing, image data Dss output from the subtraction circuit 130 have a reduced dark current component.

When the image data Dss having the reduced dark current component are reproduced, no offset due to the dark current is generated in the reproduced image and the image has appropriate density.

In the above embodiment, the detector having the insensitive areas at both ends of all elements of the stripe electrode has been explained. However, a detector used in the present invention is not limited to the detector having the insensitive areas at both ends of all elements. For example, among the elements el through en shown in the stripe electrode 15 in FIG. 2, only the elements having odd numbers may have the insensitive areas a and b at both ends thereof, while the elements having even numbers do not have the insensitive areas. In other words, the insensitive areas a and b may be located at every other element. It is needless to say that the insensitive areas a and b may be located at both ends of every several elements.

As has been described above, in the case where a detector having the insensitive areas at both ends of every second or several elements is used, the dark current reduction means 100 finds the correction data Dh in the longitudinal direction for the elements not having the insensitive areas (the elements having even numbers in the above example of insensitive areas at every other element) by using the data Da and Db of the insensitive areas of the elements having the insensitive areas. In this case, the correction data for the element having the insensitive areas may be used as the correction data for each element which does not have the insensitive areas and is sandwiched between the elements having the insensitive areas. For example, in the case where the correction data Dh2 for an element e2 are sought, correction data Dh1 for the element e1 or correction data Dh3 for an element e3 may be used as the correction data Dh2.

Alternatively, the correction data of the sandwiched element may be found by using (interpolating) the data of the insensitive areas of the elements having the insensitive areas sandwiching the sandwiched element, at the starting and ending areas of the vertical scan (hereinafter, this method is called method 1). For example, data Da2 having been found by using data of the insensitive areas Da1 and Da3 of the elements e1 and e3 at the scan start areas may be used as the data of an imaginary insensitive area of the element e2 at the scan start area while data Db2 having been found by using data of the insensitive areas Db1 and Db3 of the elements e1 and e3 at the ending areas of the scan may be used as the data of an imaginary insensitive area of the element e2 at the scan end area. Based on the data Da2 and Db2 having been found, the correction data Dh2 for the element e2 are then found in the longitudinal direction.

As has been described above, if the correction data for the elements not having the insensitive areas are found based on the data of the elements having the insensitive areas, the correction data for the entire image area can be found even when only a portion of the elements have the insensitive areas.

In the above embodiment, the detector having the insensitive areas at both ends of the elements (all elements or a portion of the elements) has been used. However, the detector to be used in the present invention is not limited to the above examples. For example, a detector having the insensitive areas at only one end of the element, that is, a detector having the insensitive areas at the vertical scan start or end area may be used. The insensitive areas may be or may not be located on all elements, as in the case of the insensitive areas at both ends of the elements.

Figure 5A:
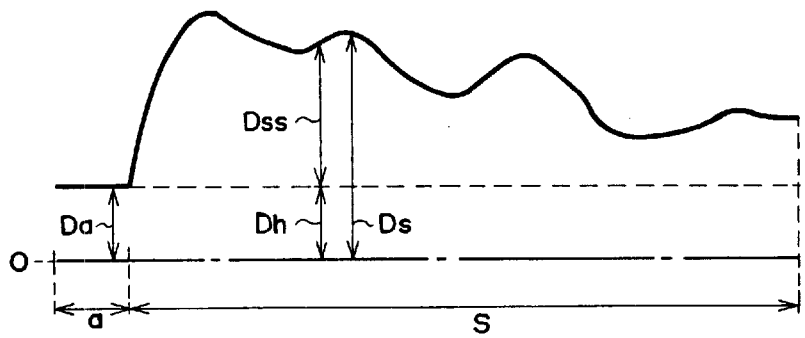
FIGS. 5A and 5B are diagrams each showing correction data and an example of a waveform of an image signal output from an amplifier in the case where an insensitive area is located at one of the ends of the electrode.

For example, if the detector has the insensitive areas only at the starting areas of the vertical scan (the side on which the amplifiers are connected) in FIG. 2, the dark current reduction means 100 uses the data Da at the starting areas a as the correction data Dh and subtracts the correction data Dh (=Da) from the data Ds of the image area S. FIG. 5(A) shows an example of an image signal in this case.

Figure 5B:
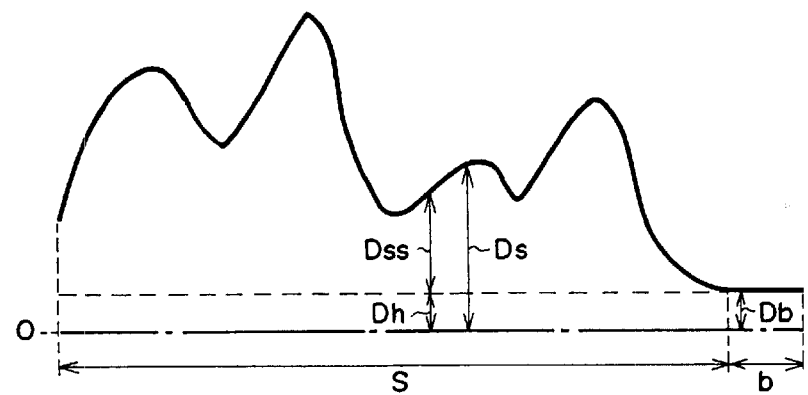

Furthermore, if the detector has the insensitive areas only at the ending areas of the vertical scan (the side on which the amplifiers are not connected) in FIG. 2, the dark current reduction means 100 uses the data Db at the ending areas b as the correction data Dh and subtracts the correction data Dh (=Db) from the data Ds of the image area S. FIG. 5(B) shows an example of an image signal in this case.

In both cases described above, by using anticipated data values as data of an imaginary insensitive area for the end where no insensitive area is actually located, the correction data gradually decreasing from the starting areas to the ending areas of the vertical scan in accordance with the position on each element in the longitudinal direction may be found, as in the case of the insensitive areas located at both ends.

In the case where the detector has the insensitive areas at either one of the ends of the stripe electrode, it is preferable that the insensitive areas exist alternately at one end and the other end. The word "alternately" means not only the case of the insensitive areas located at one end and the other end at every second electrode but also the case of at every several electrodes.

The correction data for the insensitive areas in the above case are found in the same manner as in the above case of the insensitive areas located at only one end. However, for the end where the insensitive area does not exist in one element, the data (the crude data or the interpolated data) of the insensitive area of a neighboring element having the insensitive area at the end are preferably used as the data of the imaginary insensitive area of the element not having the insensitive area at the end. In this manner, the insensitive areas are assumed to be located at both ends, and the correction data gradually decreasing from the starting to the ending areas of the vertical scan are found in accordance with each position in the longitudinal direction of the stripe electrode as in the above case of the insensitive areas at both ends (hereinafter, this is called method 2).

It is also preferable for the correction data of not only the elements having the insensitive areas at only one end but also the elements which do not have the insensitive areas and are sandwiched between elements having the insensitive areas to be found along the longitudinal direction thereof. More specifically, the above-described method 1, method 2 and any other method, and any combination of any of these methods can be used. By using the data of the insensitive areas, data found by interpolation along the direction in which the elements 15a are aligned are used as the data of the imaginary insensitive areas of the elements not having the insensitive areas, and the correction data for the elements not having the insensitive areas are found in the longitudinal direction thereof, based on the data having been found.

As has been described above, if the correction data for the elements not having the insensitive areas are found by using the data of the elements having the insensitive areas at one end thereof, the correction data for the entire image area can be found even in the case where the insensitive areas are located at only a portion of the stripe electrode.

In the above embodiment, the case where all of the current detection amplifiers 51 are connected to one side of the elements 15a of the stripe electrode 15 has been explained. However, which side of the elements 15a the current detection amplifiers 51 are connected to does not cause a problem in the case where resistance of each of the elements 15a is substantially small.

In the above embodiments, the case where the scan with the reading light is carried out by using the linear light has been explained. However, it is needless to say that each element may be scanned with a beam in the main scan direction and in the vertical scan direction thereafter. In the case where the scan with a beam is carried out, one current detection amplifier may be placed and the linear electrodes are connected so as to be sequentially changed from one to another by a switch in accordance with the scan with the beam along the main scan direction. Alternatively, an amplifier may exist for each element.

If the resistance of each of the linear electrodes 15a is not negligible, it is preferable for a fluctuation factor of the dark current component at each position along the longitudinal direction due to the resistance of each of the element 15a to be corrected. Hereinafter, an aspect of the present invention realizing this correction will be explained briefly with reference to FIG. 6.

In this aspect, one end and the other end of the stripe electrode 15 are alternately located at every second or several elements 15a and the current detection amplifiers 51 are connected to the above-described ends of the elements 15a. In the embodiment shown in FIG. 6, the current detection amplifiers are connected to the insensitive areas a and b at every 2 elements. It is convenient to place the current detection amplifiers in approximately equal areas in the vicinity of either end of the stripe electrode 15, not at only one end thereof, in order to integrate the current detection amplifiers 51 into the detector 10. The insensitive areas may be located either at both sides of the stripe electrode 15 as shown in FIG. 6 or at only one side thereof.

Dark current reduction means 100' comprising a memory 110', a correction data calculation circuit 120', and a subtraction circuit 130' is connected to each of the current detection amplifiers 51.

As shown in FIG. 1, an image signal output from the amplifiers 51 is converted into image data having digital values by an A/D converter, and input to the memory 110' in the dark current reduction means 100'. The correction data calculation circuit 120' finds the correction data Dh gradually decreasing from the starting to the ending areas of the vertical scan in accordance with a position on each element 15a, based on the image data Da and Db at the starting and ending areas thereof respectively. The correction component is found for the image signal at each position in the longitudinal direction except for the insensitive areas, based on the data Da and Db. For example, among the elements 15a, the components Da and Db for every 4 successive elements may be averaged to find the correction component of the image data. In this case, for the elements e1 through e4, correction data Dh1 to Dh4 in the longitudinal direction are found by using data of the insensitive areas Da1 and Da2 at the scan start areas of the elements e1 and e2 and the data of the insensitive areas Db3 and Db4 at the scan end areas of the elements e3 and e4, for example. This processing is repeated for the other elements.

The subtraction circuit 130' subtracts the correction data Dh from the image data Ds of the image area S for each element. In this manner, image data Dss' output from the subtraction circuit 130' have not only a reduced dark current component but also a reduced fluctuation factor at each position along the longitudinal direction due to the resistance of each element 15a.

What is claimed is:

1. A radiation image data obtaining method for obtaining an image signal representing radiation image information from a solid-state radiation detector having a capacitor for storing an electric charge in accordance with a dose of radiation irradiated thereon and a stripe electrode comprising a plurality of linear electrodes disposed on the capacitor, the solid-state radiation detector having an area insensitive to the radiation, the insensitive area corresponding to a portion of the stripe electrode in the longitudinal direction thereof, the radiation image data obtaining method comprising the step of carrying out, for each linear electrode and in the longitudinal direction of the stripe electrode, correction of a component of the image signal corresponding to an area other than the insensitive area so that a dark current component included in the image signal is reduced based on a component of the image signal corresponding to the insensitive area.

2. A radiation image data obtaining method as claimed in claim 1, wherein the solid-state radiation detector has the insensitive area in an area other than an image area in the longitudinal direction of the stripe electrode.

3. A radiation image data obtaining method as claimed in claim 2, wherein the solid-state radiation detector has the insensitive area at one end of the stripe electrode.

4. A radiation image data obtaining method as claimed in claim 2, wherein the radiation detector has the insensitive areas at both ends of the stripe electrode and the correction is carried out by finding a correction component of the image signal at-each position in the stripe electrode except for the insensitive areas in the longitudinal direction thereof, based on a component of the image signal for each of the insensitive areas at both ends.

5. A radiation image data obtaining method as claimed in claim 3 or 4, wherein the solid-state radiation detector has the insensitive area only at a portion of the linear electrodes of the stripe electrode and a correction component of the image signal at each position in the stripe electrode except for the insensitive area in the longitudinal direction thereof is found for each linear electrode not having the insensitive area, based on a component of the image signal for the insensitive area of the linear electrode having the insensitive area.

6. A radiation image data obtaining method as claimed in any one of claims 1 to 4, wherein the image signal for a portion of the linear electrodes which are aligned successively is obtained at one end of the stripe electrode and the image signal for the remaining linear electrodes among the successively aligned linear electrodes is obtained at the other end of the stripe electrode.

7. A radiation image data obtaining method as claimed in claim 5, wherein the image signal for a portion of the linear electrodes which are aligned successively is obtained at one end of the stripe electrode and the image signal for the remaining linear electrodes among the successively aligned linear electrodes is obtained at the other end of the stripe electrode.

8. A radiation image data obtaining apparatus comprising a solid-state radiation detector including a capacitor for storing an electric charge in accordance with a dose of radiation irradiated thereon and a stripe electrode comprising a plurality of linear electrodes stacked on the capacitor, and reading means for obtaining an image signal representing radiation image from the solid-state radiation detector, the radiation image data obtaining apparatus being characterized in that:

the radiation detector has an area insensitive to the radiation, the insensitive area corresponding to a portion of the stripe electrode, and the apparatus comprises dark current reduction means for carrying out, for each linear electrode and in the longitudinal direction of the stripe electrode, correction of a component of the image signal for an area other than the insensitive area so that a dark current component included in the image signal is reduced based on a component of the image signal for the insensitive area.

9. A radiation image data obtaining apparatus as claimed in claim 8, wherein the solid-state radiation detector has the insensitive areas at both ends of the stripe electrode and the dark current reduction means carries out the correction by finding a correction component for the image signal at each position in the stripe electrode in the longitudinal direction thereof except for the insensitive area, based on a component of the image signal for each of the insensitive areas at both ends.

10. A radiation image data obtaining apparatus as claimed in claim 8 or 9, wherein the solid-state radiation detector has the insensitive area only at a portion of the linear electrodes of the stripe electrode, and the dark current reduction means finds, for each linear electrode not having the insensitive area, a correction component of the image signal at each position in the stripe electrode in the longitudinal direction thereof except for the insensitive area by using a component of the image signal for the insensitive area of the linear electrode having the insensitive area.

11. A radiation image data obtaining apparatus as claimed in claim 10, wherein the reading means obtains, at one end of the stripe electrode, the image signal for a portion of the linear electrodes which are aligned successively, and obtains at the other end of the linear electrode the image signal for the remaining linear electrodes among the successively aligned linear electrodes.

12. A radiation image data obtaining apparatus as claimed in any one of claims 8 to 9, wherein the reading means obtains, at one end of the stripe electrode, the image signal for a portion of the linear electrodes which are aligned successively, and obtains, at the other end of the stripe electrode, the image signal for the remaining linear electrodes among the successively aligned linear electrodes.

13. A solid-state radiation detector including a capacitor for storing an electric charge in accordance with a dose of radiation irradiated thereon and a stripe electrode comprising a plurality of linear electrodes stacked on the capacitor, characterized in that a portion of the stripe electrode has an area which is insensitive to the radiation.

14. A solid-state radiation detector as claimed in claim 13, wherein the insensitive area is formed in an area outside a desired image area in the longitudinal direction of the stripe electrode.

15. A solid-state radiation detector as claimed in claim 14, wherein the insensitive area is formed at least at one of two ends of the stripe electrode.

16. A solid-state radiation detector as claimed in any one of claims 13 to 15, wherein the radiation detector comprises an electric current detection amplifier connected to one of the ends of the stripe electrode for obtaining the image signal for a portion of the linear electrodes aligned successively, and an electric current detection amplifier connected to the other end of the stripe electrode for obtaining the image signal for the remaining linear electrodes among the successively aligned linear electrodes.

* * * * *